United States Patent
Ahmed et al.

(10) Patent No.: US 10,424,670 B2
(45) Date of Patent: Sep. 24, 2019

(54) DISPLAY PANEL WITH REDUCED POWER CONSUMPTION

(71) Applicant: INTEL CORPORATION, Santa Clara, CA (US)

(72) Inventors: Khaled Ahmed, Anaheim, CA (US); Dong Yeung Kwak, San Jose, CA (US); Ramon C. Cancel Olmo, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 33 days.

(21) Appl. No.: 15/396,001

(22) Filed: Dec. 30, 2016

(65) Prior Publication Data

US 2018/0190678 A1 Jul. 5, 2018

(51) Int. Cl.
| | |
|---|---|
| *H01L 29/786* | (2006.01) |
| *H01L 27/12* | (2006.01) |
| *H01L 29/66* | (2006.01) |
| *H01L 21/02* | (2006.01) |
| *G09G 3/3233* | (2016.01) |

(52) U.S. Cl.
CPC .. *H01L 29/78681* (2013.01); *H01L 21/02543* (2013.01); *H01L 21/02614* (2013.01); *H01L 27/1225* (2013.01); *H01L 29/66742* (2013.01); *G09G 3/3233* (2013.01); *G09G 2300/0426* (2013.01); *G09G 2320/0247* (2013.01)

(58) Field of Classification Search
CPC ........... H01L 27/1225; H01L 21/02543; H01L 21/02653; H01L 29/20; H01L 29/66522; H01L 29/66742; H01L 29/78681; H01L 21/02595; H01L 21/02598; H01L 27/32–3297; H01L 27/1214; H01L 27/1222; H01L 27/15; H01L 27/153; H01L 27/156
See application file for complete search history.

(56) References Cited

U.S. PATENT DOCUMENTS

| | | | | |
|---|---|---|---|---|
| 4,065,781 | A * | 12/1977 | Gutknecht | H01L 21/84 257/66 |
| 7,749,825 | B2 * | 7/2010 | Honda | H01L 29/41733 438/158 |
| 9,461,070 | B2 * | 10/2016 | Li | H01L 29/26 |
| 2005/0189883 | A1 * | 9/2005 | Suh | B82Y 20/00 315/169.3 |
| 2006/0194500 | A1 * | 8/2006 | Ishii | G02F 1/134336 445/24 |
| 2007/0069212 | A1 * | 3/2007 | Saitoh | B82Y 10/00 257/59 |

(Continued)

*Primary Examiner* — Scott B Geyer
(74) *Attorney, Agent, or Firm* — International IP Law Group, P.L.L.C.

(57) ABSTRACT

A display panel with reduced power consumption is described. An example of the display panel includes an array of light emitting elements that are controllable to form an image, and a Thin-Film-Transistor (TFT) backplane comprising circuitry to drive the array of light emitting elements. The TFT backplane includes a plurality of field effect transistors (FETs). Each FET includes a source electrode, a drain electrode, a channel layer contacting the source electrode and the drain electrode, and a gate electrode adjacent to the channel layer and separated from the channel layer by an insulator. The channel layer includes a layer of metal phosphide.

14 Claims, 9 Drawing Sheets

(56) References Cited

U.S. PATENT DOCUMENTS

| | | | |
|---|---|---|---|
| 2011/0018033 A1* | 1/2011 | Takenaka | H01L 21/28264 257/192 |
| 2011/0121296 A1* | 5/2011 | Auman | C08G 73/1067 257/52 |
| 2013/0193433 A1* | 8/2013 | Yamazaki | H01L 27/0629 257/43 |
| 2015/0243718 A1* | 8/2015 | Kwon | H01L 27/1248 257/43 |
| 2017/0033192 A1* | 2/2017 | Wang | H01L 29/786 |
| 2017/0047393 A1* | 2/2017 | Bower | G06F 3/044 |
| 2018/0182275 A1* | 6/2018 | Ahmed | G09G 3/2003 |

* cited by examiner

100

500

DISPLAY PANEL WITH REDUCED POWER CONSUMPTION

TECHNICAL FIELD

The present disclosure relates generally to techniques for fabricating a display panel. More specifically, the present techniques relate to a display panel with reduced power consumption.

BACKGROUND ART

Liquid Crystal Displays (LCDs) and displays based on light-emitting diodes (LEDs) such as organic light-emitting diodes (OLEDs) and/or inorganic micro light-emitting diodes (also referred to as micro LEDs or μLEDs) may be used for applications in emerging portable electronics and wearable computers (for example, head mounted displays, head worn displays, wristwatches, wearable watch displays, Virtual Reality displays, Augmented Reality displays, OLED displays, micro LED displays, etc). One consideration in the design of such electronic devices is power savings. Power savings is particularly important for mobile devices, due to the limited power storage capacity. The display may consume a considerable portion of the total power consumption of any electronic device.

BRIEF DESCRIPTION OF THE DRAWINGS

The same numbers are used throughout the disclosure and the figures to reference like components and features. Numbers in the 100 series refer to features originally found in FIG. 1; numbers in the 200 series refer to features originally found in FIG. 2; and so on.

DESCRIPTION OF THE EMBODIMENTS

The present disclosure describes techniques for fabricating a display panel with reduced power consumption. As mentioned above, the display panel is often considerable portion of the total power consumption of any electronic device. A typical display panel includes an array of light emitting elements disposed over a Thin Film Transistor (TFT) backplane that includes circuitry for activating the light emitting elements to generate an image. One way to reduce power consumption in such devices is reduce the refresh rate applied to the light emitting elements. A typical refresh rate may be 60 Hertz (i.e., frames per second).

Reducing the refresh rate significantly below 60 Hertz tends to create flicker due to leakage current in the TFT backplane electronics used to energize the light emitting elements. Flicker occurs due to periodic changes in the intensity of luminosity that can be observed by human eyes. Flicker often appears as flashing or as contrast patterns that oscillate at a frequency that creates the impression that the image is moving or changing. Flicker tends to occur if the leakage current in the TFT backplane electronics is significant enough to affect the voltage on the light emitting elements. This can happen if the refresh rate is low and/or the leakage current is large.

The present disclosure provides a technique for fabricating TFT backplane elements with reduced leakage current. By reducing the leakage current, the frame rare of the display panel can be reduced while still preventing flicker.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Figure 1:
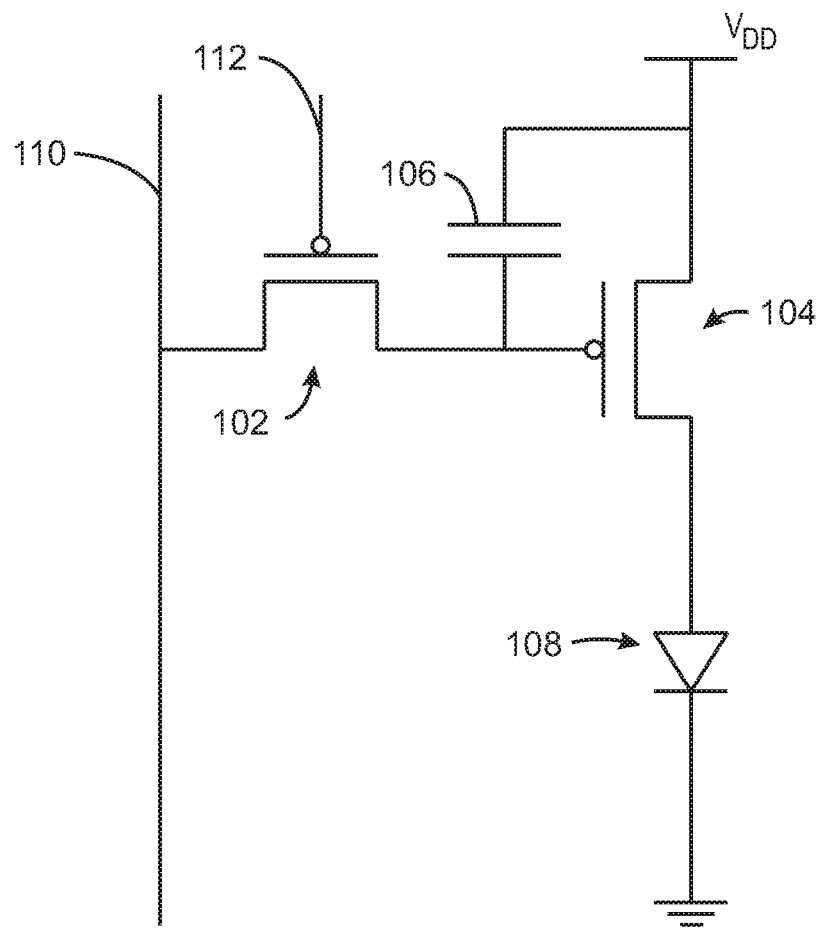
FIG. 1 is a circuit diagram of an example driver circuit used in a display panel.

FIG. 1 is a circuit diagram of an example driver circuit used in a display panel. The display panel includes array of pixels. The pixel array size may be 600×800, 960×1080, 1280×1440, or any other suitable array size depending on the desired display resolution. Each pixel of the display will include multiple light emitting elements, one for each of the colors to be generated. For example, in a Red-Green-Blue (RGB) display, each pixel will include a red element, a green element, and a blue element. Other color combinations are also possible.

Each light emitting element of the pixel array may be activated by a separate driver circuit, such as the driver circuit shown in FIG. 1. The example driver circuit 100 shown in FIG. 1 includes a first transistor 102, a second transistor 104, and a capacitor 106. The transistors 102 and 104 are a type of Field Effect Transistor (FET) known as a Thin-Film-Transistor (TFT). The transistors 102 and 104 shown in FIG. 1 are P-channel FETs. However, it will be appreciated that a drive circuit in accordance with embodiments may also be fabricated using N-channel FETs.

The driver circuit 100 is coupled to the display element, which is shown as LED 108 in this example. The LED 108 may be an organic LED (OLED), micro LED, and others. The anode of the LED 108 is coupled to a positive supply voltage, $V_{DD}$, through the second transistor 104. The cathode of the LED 108 is coupled to ground. It will be appreciated that although LED 108 is the display element in this example, the driver circuit 100 can be coupled to any suitable display element, such as a liquid crystal display element, for example. Each display element of each pixel will have a separate driver circuit 100.

The driver circuit 100 is coupled to a data line 110 and a scan line 112. For the sake of simplicity, a single scan line 112 and data line 110 are shown. However, the display panel 100 may include a separate scan line 112 for each row of pixels and a separate data line 110 for each LED in a column of pixels. The scan line 112 carries a voltage signal that activates a single row of the display panel's pixels at a time. The display panel is refreshed by periodically by scanning through each row of pixels using the scan line 112. The data line 110 carries a voltage signal that determines which light emitting elements are turned on or off while the scan line 112 is high. Each time the scan line 112 activates a row of pixels, the data line 110 updates that row of pixels by turning selected light emitting elements on or off.

When the scan line 112 is low, the first transistor 102 turns on and the second transistor 104 turns on or off depending on the voltage on the data line 110. If the data line 110 for the LED 108 is also low at this time, the second transistor 104 turns on and a charge is provided to the capacitor 106 through the positive supply voltage, VDD. While the second transistor 104 is on, the LED 108 is activated and emitting light.

After a short period, the voltage on the scan line 112 will be set to high, turning off the first transistor 102. The charge built up on the capacitor 106 will maintain the gate voltage on the second transistor 104 so that the LED 108 will remain on until the next refresh from the scan line 112. Due to leakage current through the first transistor 102, the charge on the capacitor 106 will slowly dissipate over time. This results in a reduced gate voltage on the second transistor 104, which causes the illumination intensity of the diode 108 to decrease proportionally until the next refresh.

If the refresh rate is high enough (e.g., 60 Hertz), the reduction in the illumination intensity of the diode 108 between refreshes will be imperceptible to the viewer. If the refresh rate is too low, the reduction in the illumination intensity may start to cause a perceptible flicker. In accordance with embodiments described herein, the TFTs are fabricated in way that reduces the leakage current. This enables the refresh rate to be reduced without causing flicker. For example, the refresh rate may be as low as 20 Hertz without causing flicker. As mentioned above, reducing the refresh rate enables the display panel to be operated with lower power consumption. An example of a TFT with reduced leakage current is described further below in relation to FIG. 2.

The circuit diagram of FIG. 1 is not intended to indicate that the driver circuit 100 is the only type of driver circuit that may be used to drive display elements of a display panel. Rather, the presently disclosed techniques may be implemented in various additional types of driver circuit configurations.

Figure 2:
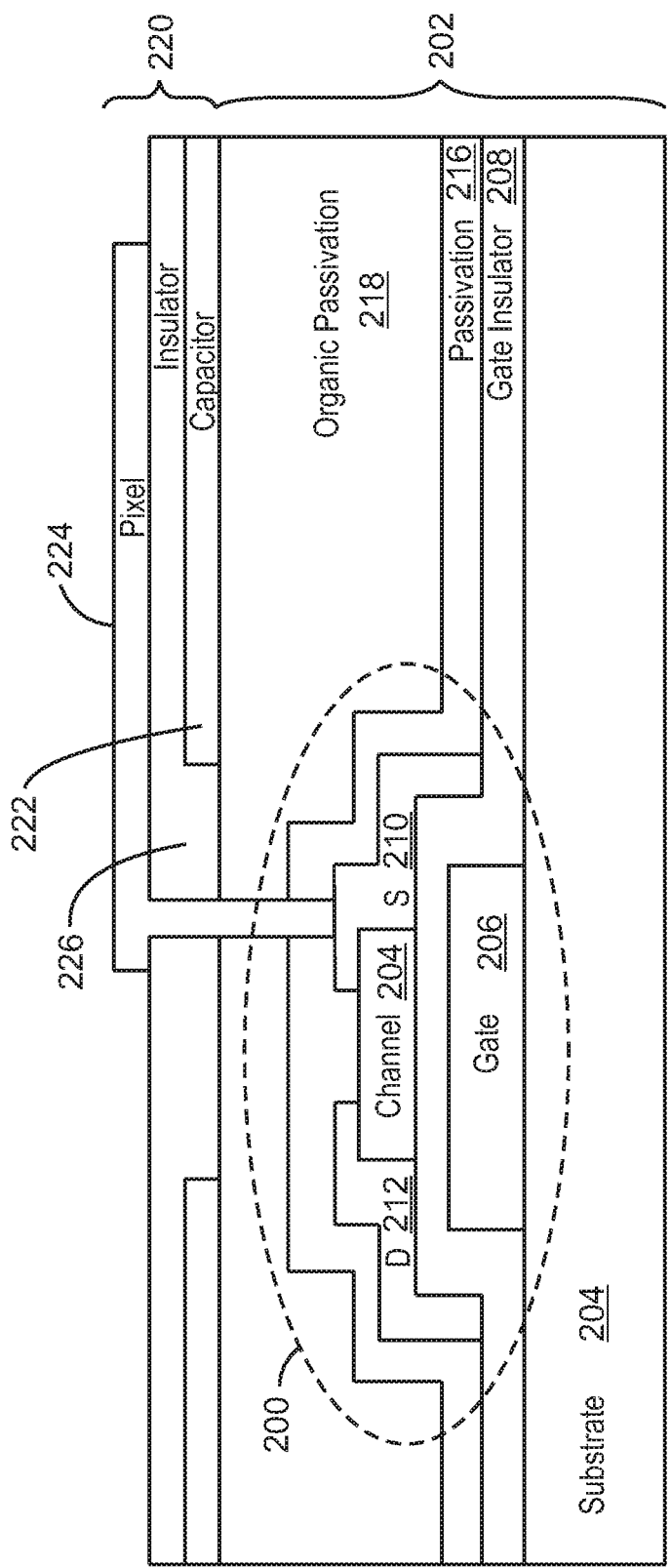
FIG. 2 is an example of a TFT backplane with reduced leakage current.

FIG. 2 is an example of a TFT backplane with reduced leakage current. FIG. 2 shows a single transistor 200, which may be transistor 102 or 104 of FIG. 1. However, it will be appreciated that the TFT backplane 202 will include multiple transistors. The TFT backplane 202 may be fabricated using any suitable semiconductor fabrication techniques. For example, the creation of various structures may be accomplished though deposition, removal, and patterning of structures. Deposition techniques include techniques such as chemical vapor deposition, physical vapor deposition (e.g., sputtering), electrochemical deposition, and others. The patterning of various features maybe accomplished through the use of photolithography. Modification of the electrical properties of the various structures may be accomplished using doping techniques such as ion implantation.

The transistor 200 may be formed on a non-conductive substrate 204, such as glass. The transistor 200 includes a gate electrode 206 disposed on the substrate 204 and a gate insulator disposed over the gate electrode 206. A source electrode 212 and drain electrode 214 are disposed above the gate electrode 206 and separated by a channel material 214. The channel material 214 is disposed above the gate electrode 206 and separated from the gate electrode 206 by the gate insulator 208. The channel material 214 may be doped to produce either an n-type semiconductor or a p-type semiconductor.

The gate electrode 206, source electrode 212, and drain electrode 214 may be any suitable type of conductor, including metals such as copper. The TFT backplane 202 can also include one or more passivation layers disposed over the transistor 200. For example, the TFT backplane 202 may include a first passivation layer 216 and an organic passivation layer 218 disposed over the first passivation layer 216. The gate insulator 208 and passivation layer 216 may be any suitable type of insulator such as silicon dioxide ($SiO_2$). The organic passivation layer 218 may be bathocuproine (BCP). The organic passivation layer 218 may be planarized to form a flat surface.

The transistor 200 uses an electric field applied to the gate electrode 206 to control the electrical conductivity of the channel 214 disposed between the source electrode 212 and the drain electrode 214. The material properties of the channel will affect the leakage current exhibited by the transistor 200. To reduce the leakage current, the channel material is formed of a high bandgap semiconductor. In some embodiments, the channel material is a crystalline or polycrystalline metal phosphide such as indium phosphide (InP) or gallium phosphide (GaP). The bandgap of indium phosphide is approximately 1.35 electronvolts (eV), and the bandgap of gallium phosphide is approximately 2.26 eV. Thus, the bandgap of these materials is higher than the bandgap of other materials that are sometimes used in TFTs such as polycrystalline silicon or hydrogenated amorphous silicon. The higher bandgap reduces the leakage current exhibited by the channel 214.

Using indium phosphide or gallium phosphide for the channel material also provides other advantages that reduce fabrication costs and improve reliability. Crystalline InP or GaP TFTs can be fabricated using a low temperature processes, e.g. around 400-450 degrees Celsius for InP and around 600 to 650 degrees Celsius for GaP. An expensive laser crystallization process is not needed to make low-temperature polysilicon TFTs. Both n-channel and p-channel InP and GaP TFTs can be made, enabling the implementation of CMOS-based circuits. Additionally, indium phosphide and gallium phosphide exhibit a higher field effect mobility and a higher current on/off ratio. Furthermore, crystalline InP and GaP TFTs do not have high bulk trap densities, and will therefore have higher stability under a constant voltage or current stress than amorphous silicon TFTs and indium gallium zinc oxide (IGZO) TFTs.

An interconnect layer 220 may be formed over the TFT backplane 202. The interconnect layer 220 includes the conductive interconnects that electrically couple the transistor 200 to other components of the display panel. As shown in FIG. 2, the interconnect layer 220 includes a capacitor interconnect 222 and a pixel interconnect 224 separated by an insulator 226. The pixel interconnect 224 is coupled to the source electrode 210 of the transistor 200. The interconnect material may be a transparent conductor such as indium tin oxide (ITO). The insulator material may be silicon mononitride (SiN). For the sake of simplicity, not all of the electrical connections are shown in FIG. 2. For example, although not shown, the capacitor interconnect 222 will be electrically coupled to the gate terminal 206 and the drain terminal 214.

The transistor 200 is an example embodiment of a TFT that may be fabricated in accordance with the present techniques. It will be appreciated that the materials used and the positions of those materials may be varied within the scope of the claims. For example, FIG. 2 shows the gate electrode 206 disposed below the source and drain electrodes 210 and 212. In other embodiments, the gate electrode 206 can be disposed above the source and drain electrodes 210 and 212. Example methods of fabricating a TFT with reduced leakage current are described further in relation to FIGS. 3A-F and 4A-G.

Figure 3A:
FIGS. 3A-F illustrate an example process for fabricating a TFT that exhibits reduced leakage current.

FIGS. 3A-F illustrate an example process for fabricating a TFT that exhibits reduced leakage current. The process begins by forming a buffer layer 300 over a non-conductive supporting substrate 302, as shown in FIG. 3A. The substrate 302 may be glass. The buffer material 300 may be silicon dioxide (SiO2).

Figure 3B:
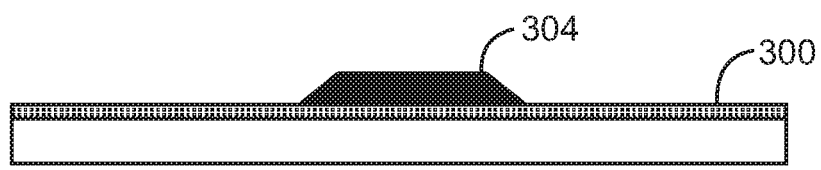
Figure 3C:
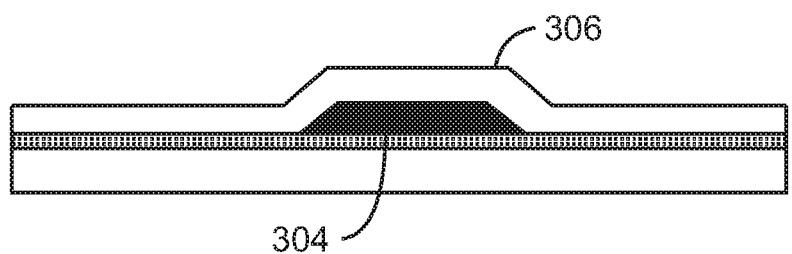

A gate electrode 304 is formed over the buffer layer 300, as shown in FIG. 3B. The gate electrode 304 may be any suitable conductive material, including metals such as copper. A gate insulator 306 such as silicon dioxide (SiO2) or other dielectric material is formed over the gate electrode 304, as shown in FIG. 3C.

Figure 3D:
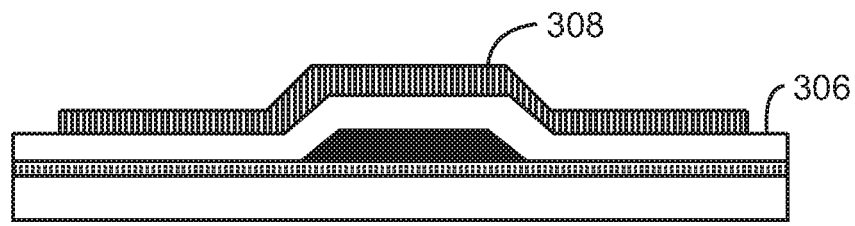

A channel layer 308 is formed over the gate insulator 306 as shown in FIG. 3D. In some embodiments, the channel layer 308 is indium phosphide or gallium phosphide. The channel layer 308 may be formed using a thin-film Vapor-Liquid-Solid (VLS) process. In the VLS process, indium metal or gallium metal is deposited over the gate insulator 306 and a porous capping layer (not shown) is formed over the metal. The capping layer may be a porous silicon oxide (SiOx). The stack formed by the metal layer and the capping layer is then patterned and etched to form islands. The size of the islands may be determined based on the desired size of the final channel. For example, if the channel is to be 10 micrometers long and 20 micrometers wide, the size of the islands will be approximately 264 square micrometers (10+2)×(20+2). The size of the islands may be up to approximately 2500 micrometers squared.

The resulting stacks are then heated in an environment of phosphine ($PH_3$) and hydrogen ($H_2$) gas. The stacks may be heated for approximately 1 to 60 minutes. For indium phosphide, the heating temperature may be approximately 400 to 450 degrees Celsius. For gallium phosphide, the heating temperature may be approximately 600 to 650 degrees Celsius. The heating causes the metal (indium or gallium) to liquefy and breaks the $PH_3$ bonds to produce phosphorous. The phosphorous combines with the metal to produce solid indium phosphide or gallium phosphide, depending on the type of metal used. The capping layer limits the vertical growth of the metal phosphide layer and causes the metal phosphide to grow laterally. During the reaction, the temperature is controlled to control the metal-to-phosphorous ratio in the solid metal phosphide. After formation of the channel layer 308, the channel layer 308 may be doped to produce either an n-type semiconductor or a p-type semiconductor.

Figure 3E:
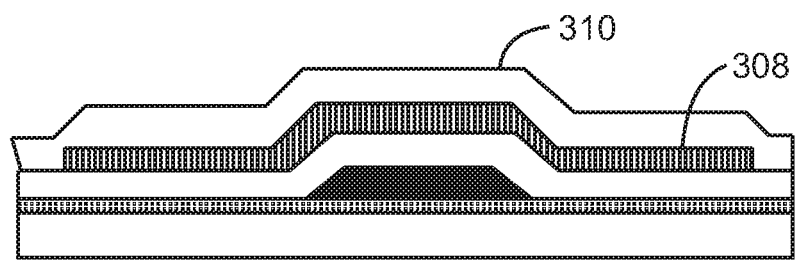
Figure 3F:
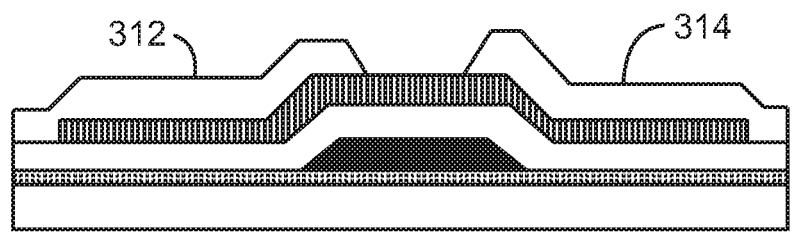

Next, source and drain metal 310 is formed over the channel layer 308 as shown in FIG. 3E. The metal can be any suitable metal, such as copper. The metal layer may be formed using any suitable metal deposition process. Next, the source electrode 312 and drain electrode 314 are formed by patterning the metal layer as shown in FIG. 3F. After the source electrode 312 and drain electrode 314 are formed, the resulting structure may be annealed by heating the structure in an environment of Nitrogen gas at a temperature of approximately 350 degrees Celsius.

Figure 4A:
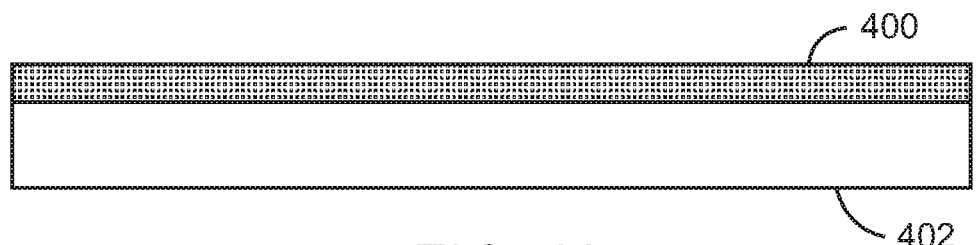
FIGS. 4A-G illustrate another example process for fabricating a TFT that exhibits reduced leakage current

FIGS. 4A-G illustrate another example process for fabricating a TFT that exhibits reduced leakage current. The process begins by forming a buffer layer 400 over a non-conductive supporting substrate 402, as shown in FIG. 4A. The substrate 402 may be glass. The buffer material 400 may be silicon dioxide (SiO2).

Figure 4B:
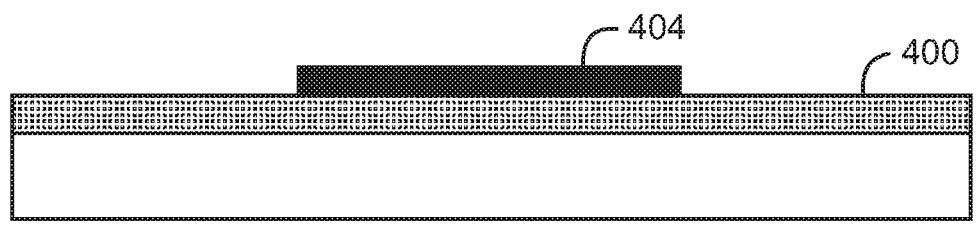
Figure 4C:
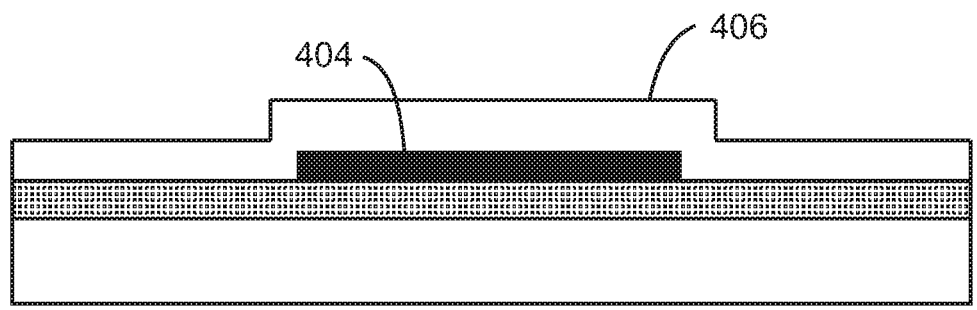

A gate electrode 404 is formed over the buffer layer 400, as shown in FIG. 4B. The gate electrode 404 may be any suitable conductive material, including metals such as copper. A gate insulator 406 such as silicon dioxide (SiO2) or other dielectric material is formed over the gate electrode 404, as shown in FIG. 4C.

Figure 4D:
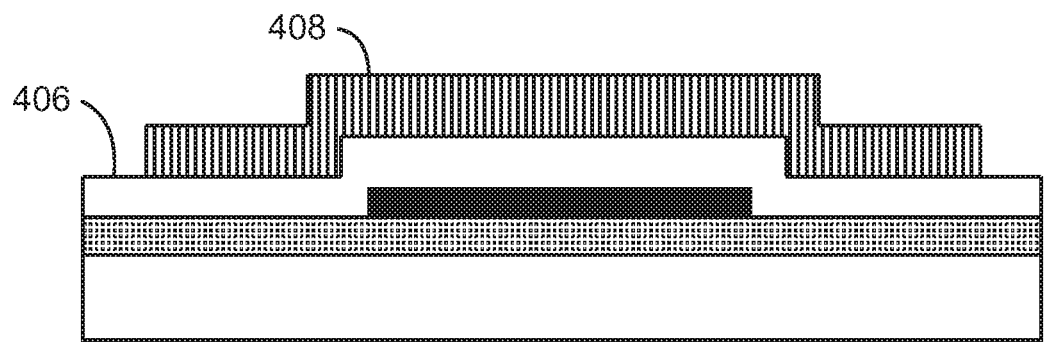

A channel layer 408 is formed over the gate insulator 406, as shown in FIG. 4D. In some embodiments, the channel layer is a metal phosphide such as indium phosphide or gallium phosphide. The channel layer may be formed using the thin-film Vapor-Liquid-Solid (VLS) process described above in relation to FIG. 3D. After formation of the channel layer 408, the channel layer 4 may be doped to produce either an n-type semiconductor or a p-type semiconductor.

Figure 4E:
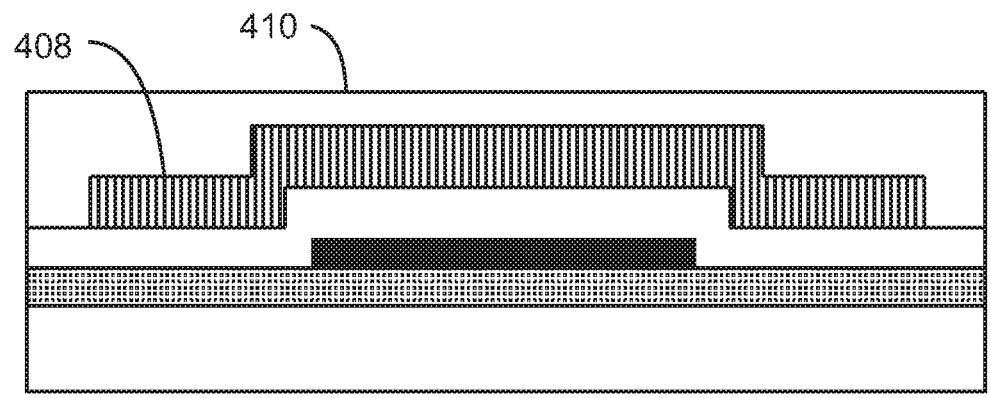
Figure 4F:
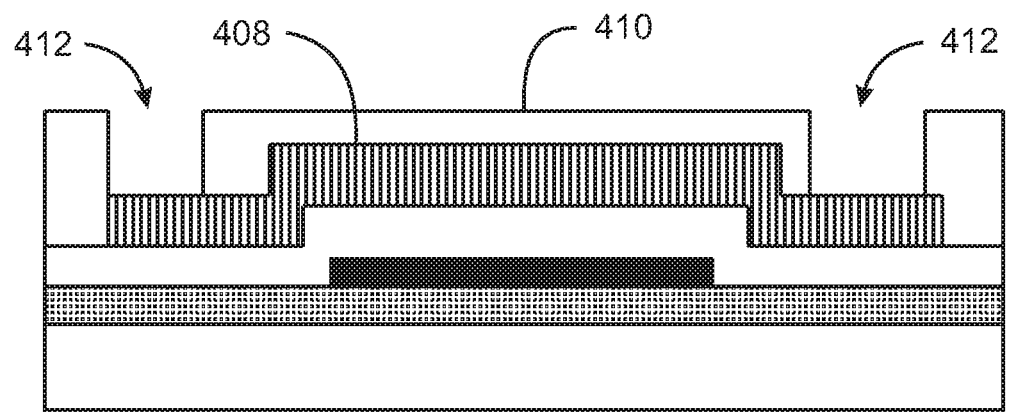

Next, an interlayer dielectric 410 such as silicon dioxide (SiO2) or other dielectric material is formed over the channel layer 408, as shown in FIG. 4E. The interlayer dielectric 410 is then patterned and etched to form contact openings 412 to the channel layer 408 below, as shown in FIG. 4F. The etching process may be a buffered oxide etch, for example.

Figure 4G:
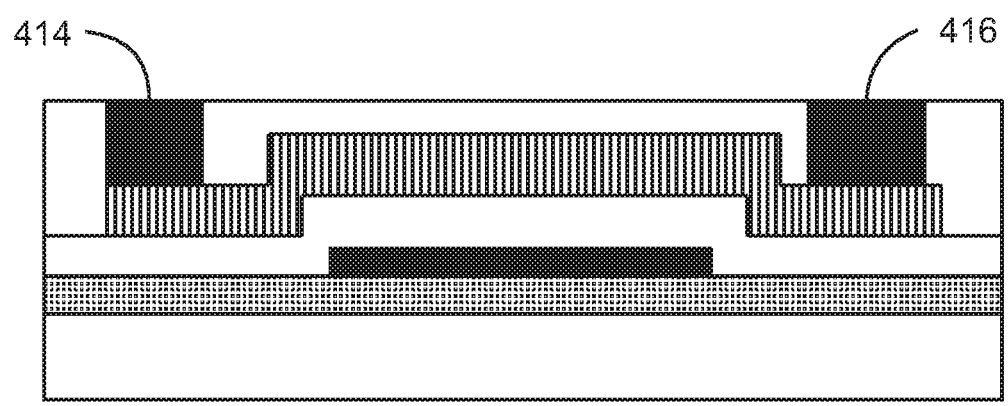

Next, metal is deposited in the contact openings to form the source electrode 414 and drain electrode 416, as shown in FIG. 4G. The metal can be any suitable metal, such as copper. The metal may be deposited using any suitable metal deposition process. After the source electrode 414 and drain electrode 416 are formed, the resulting structure may be annealed by heating the structure in an environment of Nitrogen gas at a temperature of approximately 350 degrees Celsius.

Figure 5:
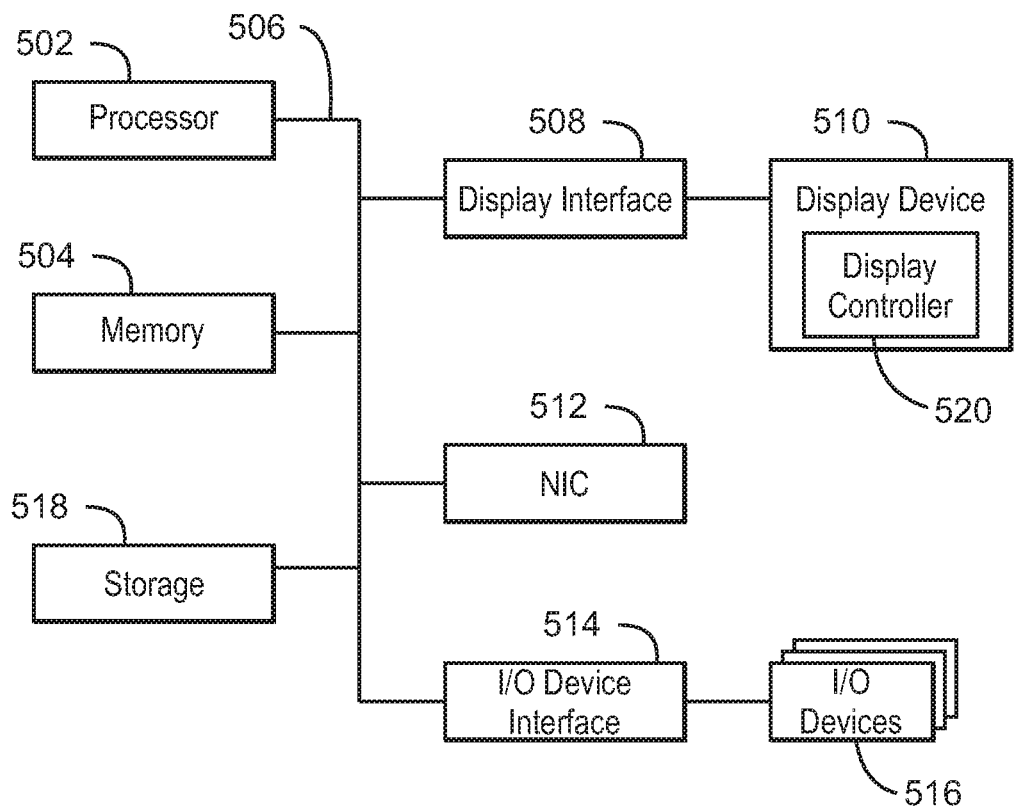
FIG. 5 is a block diagram of an example of a computing device 500 with a display that exhibits reduced leakage current.

FIG. 5 is a block diagram of an example of a computing device 500 with a display that exhibits reduced leakage current. The computing device 500 may be, for example, a mobile phone, mobile device, handset, laptop computer, desktop computer, or tablet computer, among others. The computing device 500 may include a processor 502 that is adapted to execute stored instructions, as well as a memory device 504 (and/or storage device 504) that stores instructions that are executable by the processor 502. The processor 502 can be a single core processor, a multi-core processor, a computing cluster, or any number of other configurations. For example, processor 502 can be an Intel® processor such as an Intel® Celeron, Pentium, Core, Core i3, Core i5, or Core i7 processor. In some embodiments, processor 502 can be an Intel® x86 based processor. In some embodiments, processor 502 can be an ARM based processor. The memory device 504 can be a memory device and/or a storage device, and can include volatile storage, non-volatile storage, random access memory, read only memory, flash memory, or any other suitable memory or storage systems. The instructions that are executed by the processor 502 may also be used to implement display driver control as described in this specification.

The processor 502 may also be linked through the system interconnect 506 (e.g., PCI®, PCI-Express®, NuBus, etc.) to a display interface 508 adapted to connect the computing device 500 to a display device 510. The display device 510 may include a display screen, which may be a built-in component of the computing device 500. The display device 510 may also include a computer monitor, or television externally connected to the computing device 500. The display device 510 can include light emitting diodes (LEDs), organic light emitting diodes (OLEDs), and/or micro-LEDs, among others. The display device 510 also includes a TFT backplane, which includes circuitry for driving the LEDs. The TFT backplane can include any of the reduced leakage current transistors described herein above.

In some embodiments, the display interface 508 can include any suitable graphics processing unit, transmitter, port, physical interconnect, and the like. In some examples, the display interface 508 can implement any suitable protocol for transmitting data to the display device 510. For example, the display interface 508 can transmit data using a high-definition multimedia interface (HDMI) protocol, a DisplayPort protocol, or some other protocol or communication link, and the like.

In addition, a network interface controller (also referred to herein as a NIC) 512 may be adapted to connect the computing device 500 through the system interconnect 506 to a network (not depicted). The network (not depicted) may be a cellular network, a radio network, a wide area network (WAN), a local area network (LAN), or the Internet, among others.

The processor 502 may be connected through system interconnect 506 to an input/output (I/O) device interface 514 adapted to connect the computing host device 500 to one or more I/O devices 516. The I/O devices 516 may include, for example, a keyboard and/or a pointing device, where the pointing device may include a touchpad or a touchscreen, among others. The I/O devices 516 may be built-in components of the computing device 500, or may be devices that are externally connected to the computing device 500.

In some embodiments, the processor 502 may also be linked through the system interconnect 506 to a storage device 518 that can include a hard drive, a solid state drive (SSD), a magnetic drive, an optical drive, a USB flash drive, an array of drives, or any other type of storage, including combinations thereof. In some embodiments, the storage device 518 can include any suitable applications.

In some embodiments, display device 510 includes a display controller 520. In some embodiments, the display controller 520 can provide control signals within and/or to the display device 510. In some embodiments, display controller 520 can be included in the display interface 508 (and/or instead of the display interface 508). In some embodiments, display controller 520 can be coupled between the display interface 508 and the display device 510. In some embodiments, the display controller 520 can be coupled between the display interface 508 and the interconnect 506. In some embodiments, the display controller 520 can be included in the processor 502.

The display controller 520 implements the driving of display pixels and determines the refresh rate of the display device 510. In some examples, the refresh rate may be approximately 60 Hertz. Additionally, the reduced leakage current exhibited by the TFTs of the TFT backplane enables the display controller 520 to drive the display pixels at a reduced refresh rate (i.e., below 60 Hertz) without causing flicker. For example, the refresh rate may be 50 Hertz, 40 Hertz, 30 Hertz, 20 Hertz, or lower. In some embodiments, the display controller 520 is configured to adaptively control the refresh rate of the display device 510 depending on the power usage mode. For example, the display controller 520 may reduce the refresh rate of the display screen 510 during low power modes of the computing device 500.

It is to be understood that the block diagram of FIG. 5 is not intended to indicate that the computing device 500 is to include all of the components shown in FIG. 5. Rather, the computing device 500 can include fewer or additional components not illustrated in FIG. 5 (e.g., additional memory components, embedded controllers, additional modules, additional network interfaces, etc.).

Figure 6:
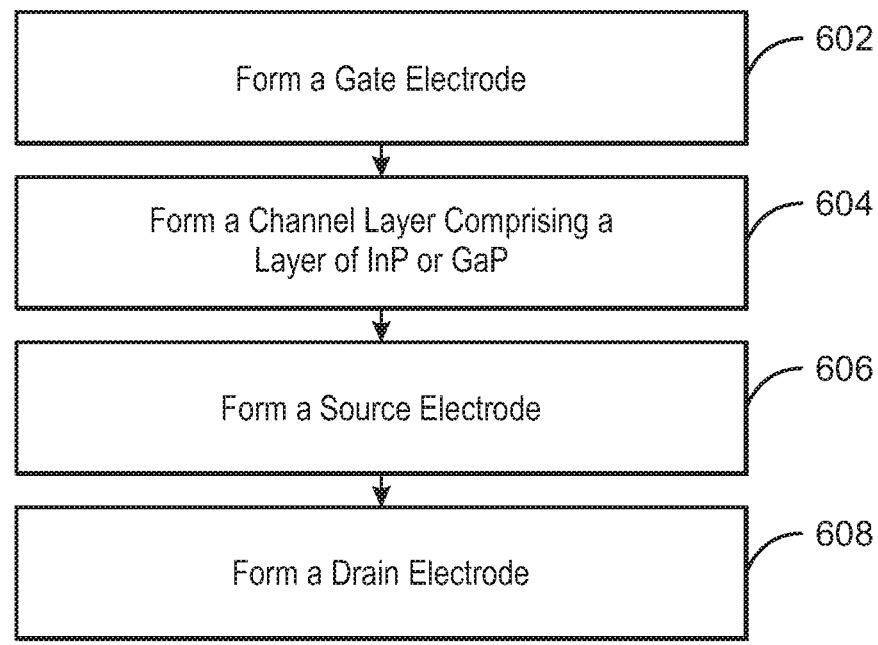
FIG. 6 is a process flow diagram summarizing an example method of fabricating a TFT that exhibits reduced leakage current.

FIG. 6 is a process flow diagram summarizing an example method of fabricating a TFT that exhibits reduced leakage current. The TFTs shown in FIGS. 1, 2, 3F and 4G are examples of TFTs that may be fabricated using the method 600. The method 600 should not be interpreted as meaning that the blocks are necessarily performed in the order shown. For example, the order of the performance may vary depending on whether the TFT is a gate-on-top TFT, gate-on-bottom TFT, or other configuration. Furthermore, fewer or additional actions can be included in the method 600 depending on the design considerations of a particular implementation.

At block 602, a gate electrode is formed.

At block 604, a channel layer is formed. The channel layer is formed adjacent to the gate electrode. For example, if the gate electrode is formed first, the channel layer may be formed above the gate electrode after an insulator is formed over the gate electrode. If the channel layer is formed first, the gate electrode may be formed above the channel layer after an insulator is formed over the channel layer. The channel layer is a layer of metal phosphide, such as indium phosphide or gallium phosphide. The formation of the channel layer is described in more detail above in relation to FIG. 3D.

At block 606, a source electrode is formed. The source electrode is formed so that it will be in contact with the channel layer. The source electrode may be formed above or below the channel layer, depending on which is formed first.

At block 608, a drain electrode is formed. The drain electrode is formed so that it will also be in contact with the channel layer, such that the source electrode and drain electrode will be coupled to each other through the channel layer. The drain electrode may be formed above or below the channel layer, depending on which is formed first.

EXAMPLES

Example 1 is a display panel with reduced power consumption. The display panel includes an array of light emitting elements that are controllable to form an image, and a Thin-Film-Transistor (TFT) backplane with circuitry to drive the array of light emitting elements. The TFT backplane includes a plurality of Field Effect Transistors (FETs). At least one of the FETs includes a source electrode, a drain electrode, a channel layer contacting the source electrode and the drain electrode, and a gate electrode adjacent to the channel layer and separated from the channel layer by an insulator. The channel layer includes a layer of metal phosphide.

Example 2 includes the display panel of example 1. In this example, the layer of metal phosphide is a layer of indium phosphide.

Example 3 includes the display panel of any one of examples 1 to 2. In this example, the layer of metal phosphide is a layer of gallium phosphide.

Example 4 includes the display panel of any one of examples 1 to 3. In this example, a bandgap of the layer of metal phosphide is greater than 1.3 electronvolts (eV).

Example 5 includes the display panel of any one of examples 1 to 4. In this example, a bandgap of the layer of metal phosphide is greater than 2.2 electronvolts (eV).

Example 6 includes the display panel of any one of examples 1 to 5. In this example, the layer of metal phosphide is formed using a thin-film Vapor-Liquid-Solid (VLS) process.

Example 7 includes the display panel of any one of examples 1 to 6. In this example, the display panel is operable at a refresh rate of less than 50 Hertz without exhibiting flicker.

Example 8 includes the display panel of any one of examples 1 to 7. In this example, the display panel is operable at a refresh rate of less than 30 Hertz without exhibiting flicker.

Example 9 includes the display panel of any one of examples 1 to 8. In this example, refresh rate of the display panel is selectively controllable depending on a power usage mode of the display panel.

Example 10 includes the display panel of any one of examples 1 to 9. In this example, the channel layer is a P-type semiconductor.

Example 11 is an electronic device with a low power display. The electronic device includes a display device with an plurality of light emitting elements that are controllable to form an image. The display device also includes a Thin-Film-Transistor (TFT) backplane with circuitry to drive the plurality of light emitting elements, and a display controller to drive the plurality of light emitting elements via the TFT backplane. The TFT backplane includes a plurality of Field Effect Transistors (FETs). At least one of the FETs includes: a source electrode and a drain electrode; a channel layer contacting the source electrode and the drain electrode; and a gate electrode adjacent to the channel layer and separated from the channel layer by an insulator. The channel layer includes a layer of metal phosphide.

Example 12 includes the electronic device of example 11. In this example, the layer of metal phosphide is a layer of indium phosphide.

Example 13 includes the electronic device of any one of examples 11 to 12. In this example, the layer of metal phosphide is a layer of gallium phosphide.

Example 14 includes the electronic device of any one of examples 11 to 13. In this example, a bandgap of the layer of metal phosphide is greater than 1.3 electronvolts (eV).

Example 15 includes the electronic device of any one of examples 11 to 14. In this example, a bandgap of the layer of metal phosphide is greater than 2.2 electronvolts (eV).

Example 16 includes the electronic device of any one of examples 11 to 15. In this example, the layer of metal phosphide is formed using a thin-film Vapor-Liquid-Solid (VLS) process.

Example 17 includes the electronic device of any one of examples 11 to 16. In this example, the display device is operable at a refresh rate of less than 50 Hertz without exhibiting flicker.

Example 18 includes the electronic device of any one of examples 11 to 17. In this example, the display device is operable at a refresh rate of less than 30 Hertz without exhibiting flicker.

Example 19 includes the electronic device of any one of examples 11 to 18. In this example, a refresh rate of the display device is selectively controllable depending on a power usage mode of the display device.

Example 20 includes the electronic device of any one of examples 11 to 19. In this example, the channel layer is a P-type semiconductor.

Example 21 is a method of fabricating a Thin-Film-Transistor (TFT) for a low power display panel. The method includes: forming a gate electrode; forming a channel layer adjacent to the gate electrode and separated from the gate electrode by an insulator; forming a source electrode that contacts the channel layer; and forming a drain electrode that contacts the channel layer, wherein the source electrode and drain electrode are coupled to each other through the channel layer. The channel layer includes a layer of metal phosphide.

Example 22 includes the method of example 21. In this example, the layer of metal phosphide is a layer of indium phosphide.

Example 23 includes the method of any one of examples 21 to 22. In this example, the layer of metal phosphide is a layer of gallium phosphide.

Example 24 includes the method of any one of examples 21 to 23. In this example, a bandgap of the layer of metal phosphide is greater than 1.3 electronvolts (eV).

Example 25 includes the method of any one of examples 21 to 24. In this example, a bandgap of the layer of metal phosphide is greater than 2.2 electronvolts (eV).

Example 26 includes the method of any one of examples 21 to 25. In this example, forming the layer of metal phosphide includes a thin-film Vapor-Liquid-Solid (VLS) process.

Example 27 includes the method of any one of examples 21 to 26. In this example, the channel layer is a P-type semiconductor.

Example 28 includes the method of any one of examples 21 to 27. In this example, the channel layer is an N-type semiconductor.

Example 29 includes the method of any one of examples 21 to 28. In this example, forming the channel layer includes forming the channel layer over the gate electrode after forming an insulating layer over the gate electrode.

Example 30 includes the method of any one of examples 21 to 29. In this example, forming the gate electrode includes forming the gate electrode over the channel layer after forming an insulating layer over the channel layer.

Example 31 is an apparatus for displaying an image. The apparatus includes means for driving an array of light emitting elements that are controllable to form an image. The means for driving includes a plurality of transistors. At least one of the transistors includes: a source electrode and a drain electrode; a channel layer contacting the source electrode and the drain electrode; and a gate electrode adjacent to the channel layer and separated from the channel layer by an insulator. The channel layer includes a layer of metal phosphide.

Example 32 includes the apparatus of example 31. In this example, the layer of metal phosphide is a layer of indium phosphide.

Example 33 includes the apparatus of any one of examples 31 to 32. In this example, the layer of metal phosphide is a layer of gallium phosphide.

Example 34 includes the apparatus of any one of examples 31 to 33. In this example, a bandgap of the layer of metal phosphide is greater than 1.3 electronvolts (eV).

Example 35 includes the apparatus of any one of examples 31 to 34. In this example, a bandgap of the layer of metal phosphide is greater than 2.2 electronvolts (eV).

Example 36 includes the apparatus of any one of examples 31 to 35. In this example, the layer of metal phosphide is formed using a thin-film Vapor-Liquid-Solid (VLS) process.

Example 37 includes the apparatus of any one of examples 31 to 36. In this example, the means for driving the array of light emitting elements refreshes the array of light emitting elements at a rate of less than 50 frames per second without exhibiting flicker.

Example 38 includes the apparatus of any one of examples 31 to 37. In this example, the means for driving the array of light emitting elements refreshes the array of light emitting elements at a rate of less than 30 frames per second without exhibiting flicker.

Example 39 includes the apparatus of any one of examples 31 to 38. In this example, the means for driving the array of light emitting elements controls a refresh rate of the array of light emitting elements depending on a power usage mode of the apparatus.

Example 40 includes the apparatus of any one of examples 31 to 39. In this example, the channel layer is a P-type semiconductor.

Some embodiments may be implemented in one or a combination of hardware, firmware, and software. Some embodiments may also be implemented as instructions stored on the tangible, non-transitory, machine-readable medium, which may be read and executed by a computing platform to perform the operations described. In addition, a machine-readable medium may include any mechanism for storing or transmitting information in a form readable by a machine, e.g., a computer. For example, a machine-readable medium may include read only memory (ROM); random access memory (RAM); magnetic disk storage media; optical storage media; flash memory devices; or electrical, optical, acoustical or other form of propagated signals, e.g., carrier waves, infrared signals, digital signals, or the interfaces that transmit and/or receive signals, among others.

An embodiment is an implementation or example. Reference in the specification to "an embodiment," "one embodiment," "some embodiments," "various embodiments," or "other embodiments" means that a particular feature, structure, or characteristic described in connection with the embodiments is included in at least some embodiments, but not necessarily all embodiments, of the present techniques. The various appearances of "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included, If the specification or claim refers to "a" or "an" element, that does not mean there is only one of the element. If the specification or claims refer to "an additional" element, that does not preclude there being more than one of the additional element.

It is to be noted that, although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

It is to be understood that specifics in the aforementioned examples may be used anywhere in one or more embodiments. For instance, all optional features of the computing device described above may also be implemented with respect to either of the method or the computer-readable medium described herein. Furthermore, although flow diagrams and/or state diagrams may have been used herein to describe embodiments, the techniques are not limited to those diagrams or to corresponding descriptions herein. For example, flow need not move through each illustrated box or state or in exactly the same order as illustrated and described herein.

The present techniques are not restricted to the particular details listed herein. Indeed, those skilled in the art having the benefit of this disclosure will appreciate that many other variations from the foregoing description and drawings may be made within the scope of the present techniques. Accordingly, it is the following claims including any amendments thereto that define the scope of the present techniques.

What is claimed is:

1. An apparatus comprising:
   an array of light emitting elements that are controllable to form an image;
   a Thin-Film-Transistor (TFT) backplane comprising circuitry to drive the array of light emitting elements, the TFT backplane comprising a plurality of Field Effect Transistors (FETs), at least one of the FETs comprising:
   a source electrode and a drain electrode;
   a channel layer contacting the source electrode and the drain electrode; and
   a gate electrode adjacent to the channel layer and separated from the channel layer by an insulator;
   wherein the channel layer comprises a layer of metal phosphide with a bandgap greater than 2.20 electronvolts (eV).

2. The apparatus of claim 1, wherein the layer of metal phosphide is a layer of gallium phosphide.

3. The apparatus of claim 1, wherein the layer of metal phosphide is formed using a thin-film Vapor-Liquid-Solid (VLS) process.

4. The apparatus of claim 1, comprising a display controller to drive the display panel at a refresh rate of less than 50 Hertz without exhibiting flicker.

5. The apparatus of claim 1, comprising a display controller to drive the display panel at a refresh rate of less than 30 Hertz without exhibiting flicker.

6. The apparatus of claim 1, comprising a display controller to drive the display panel at a refresh rate that is selected depending on a power usage mode of the display panel.

7. The apparatus of claim 1, wherein the channel layer is a P-type semiconductor.

8. An apparatus comprising:
   a display device comprising an plurality of light emitting elements that are controllable to form an image, and a Thin-Film-Transistor (TFT) backplane comprising circuitry to drive the plurality of light emitting elements; and
   a display controller to drive the plurality of light emitting elements via the TFT backplane;
   wherein the TFT backplane comprises a plurality of Field Effect Transistors (FETs), at least one of the FETs comprising:
   a source electrode and a drain electrode;
   a channel layer contacting the source electrode and the drain electrode; and
   a gate electrode adjacent to the channel layer and separated from the channel layer by an insulator;
   wherein the channel layer comprises a layer of gallium phosphide.

9. The apparatus of claim 8, wherein a bandgap of the layer of gallium phosphide is greater than 2.2 electronvolts (eV).

10. The apparatus of claim 8, wherein the layer of metal phosphide is formed using a thin-film Vapor-Liquid-Solid (VLS) process.

11. The apparatus of claim 8, wherein the display controller is to drive the plurality of light emitting elements at a refresh rate of less than 50 Hertz without exhibiting flicker.

12. The apparatus of claim 8, wherein the display controller is to drive the plurality of light emitting elements at a refresh rate of less than 30 Hertz without exhibiting flicker.

13. The apparatus of claim 8, wherein the display controller is to drive the plurality of light emitting elements at a refresh rate that is selected based on a power usage mode of the display device.

14. The apparatus of claim 8, wherein the channel layer is a P-type semiconductor.

\* \* \* \* \*